(12) United States Patent
Hasan et al.

(10) Patent No.: US 10,062,831 B2
(45) Date of Patent: Aug. 28, 2018

(54) STRUCTURAL HEALTH MANAGEMENT APPARATUS AND SYSTEM

(71) Applicant: The Boeing Company, Chicago, IL (US)

(72) Inventors: Zeaid F. Hasan, Charleston, SC (US); Jade M. Brown, Charleston, SC (US); Joseph B. Harriman, Charleston, SC (US); Kayla M. Gagnon, Charleston, SC (US)

(73) Assignee: The Boeing Company, Chicago, IL (US)

( * ) Notice: Subject to any disclaimer, the term of this patent is extended or adjusted under 35 U.S.C. 154(b) by 417 days.

(21) Appl. No.: 14/818,480

(22) Filed: Aug. 5, 2015

(65) Prior Publication Data
US 2017/0040524 A1 Feb. 9, 2017

(51) Int. Cl.
*H01L 41/09* (2006.01)
*G01M 5/00* (2006.01)
(Continued)

(52) U.S. Cl.
CPC .............. *H01L 41/09* (2013.01); *G01L 1/16* (2013.01); *G01M 5/0016* (2013.01); *G01M 5/0066* (2013.01); *G01M 5/0083* (2013.01); *H01L 41/042* (2013.01); *H01L 41/0805* (2013.01); *H01L 41/113* (2013.01)

(58) Field of Classification Search
USPC .................................................. 310/310–371
See application file for complete search history.

(56) References Cited

U.S. PATENT DOCUMENTS

| 7,469,595 B2 * | 12/2008 | Kessler ................. G01L 1/162 73/583 |
| 8,237,548 B2 | 8/2012 | Fay et al. |

(Continued)

FOREIGN PATENT DOCUMENTS

EP 2889596 7/2015

OTHER PUBLICATIONS

European Patent Office, Partial European Search Report, EP 16 16 8590 (dated Dec. 23, 2016).
(Continued)

*Primary Examiner* — Thomas Dougherty
(74) *Attorney, Agent, or Firm* — Walters & Washylyna LLC

(57) ABSTRACT

A structural health management system may include a structural health management apparatus including a carbon nanotube element configured to generate an electrical output in response to a deformation of the carbon nanotube element, a piezoelectric element configured to actuate in response to an electrical voltage applied to the piezoelectric element, electrode elements coupled to the carbon nanotube element and the piezoelectric element, and a controller communicatively coupled to the structural health management apparatus, wherein the controller is configured to convert the electrical output into data representing a measurement value of a structural abnormality and to initiate application of the electrical voltage to the piezoelectric element to counter the structural abnormality upon the measurement value being equal to or greater than a predetermined threshold value.

20 Claims, 7 Drawing Sheets

(51) Int. Cl.
*G01L 1/16* (2006.01)
*H01L 41/04* (2006.01)
*H01L 41/08* (2006.01)
*H01L 41/113* (2006.01)

(56) References Cited

U.S. PATENT DOCUMENTS

| | | | |
|---|---|---|---|
| 8,833,430 B2* | 9/2014 | Aizenberg | B29C 39/026 |
| | | | 164/45 |
| 8,880,242 B2 | 11/2014 | Hinnant et al. | |
| 8,901,802 B1* | 12/2014 | Que | H01L 41/1136 |
| | | | 310/330 |
| 2011/0140579 A1* | 6/2011 | Moon | H01L 41/1136 |
| | | | 310/339 |
| 2012/0133247 A1* | 5/2012 | Lee | H01L 41/183 |
| | | | 310/339 |
| 2016/0020280 A1* | 1/2016 | Heo | H01L 45/04 |
| | | | 257/27 |

OTHER PUBLICATIONS

European Patent Office, Extended European Search Report, EP 16 16 8590 (dated Apr. 12, 2017).
European Patent Office, Communication Pursuant to Article 94(3) EPC, EP 16 168 590.4 (Oct. 25, 2017).
European Patent Office, Reasons for Rejection, EP 16 168 590.4, pp. 1-3 (dated Oct. 25, 2017).

* cited by examiner

STRUCTURAL HEALTH MANAGEMENT APPARATUS AND SYSTEM

FIELD

The present disclosure is generally related to systems and methods for structural health management and, more particularly, to systems and methods actively monitoring the structural health of a structure and countering structural abnormalities using a wireless structural health monitoring apparatus.

BACKGROUND

Various types of sensors may be used to monitor the structural health of a structure. Typically, structural health monitoring requires many densely distributed sensors to capture component-level damage within larger structures. The complexities associated with wiring all of the sensors grow in tandem with the monitoring system. While wireless sensors may represent one solution, they remain hindered by their dependence on local power sources (e.g., batteries). In addition, there is lack of a system that enables active response to structural ambiguities (e.g., excessive strain) within the structure.

Accordingly, those skilled in the art continue with research and development efforts in the field of structural health management.

SUMMARY

In one embodiment, the disclosed structural health management apparatus may include a carbon nanotube element configured to generate an electrical output in response to a deformation of the carbon nanotube element, a piezoelectric element configured to deform in response to an electrical voltage applied to the piezoelectric element, and electrode elements coupled to the carbon nanotube element and the piezoelectric element.

In another embodiment, the disclosed structural health management system may include a structural health management apparatus including a carbon nanotube element configured to generate an electrical output in response to a deformation of the carbon nanotube element, a piezoelectric element configured to actuate in response to an electrical voltage applied to the piezoelectric element, and electrode elements coupled to the carbon nanotube element and the piezoelectric element, and a controller communicatively coupled to the structural health management apparatus, wherein the controller is configured to convert the electrical output into data representing a measurement value of a structural abnormality and initiate application of the electrical voltage to the piezoelectric element to counter the structural abnormality upon the measurement value being equal to or greater than a predetermined threshold value.

In yet another embodiment, the disclosed method for managing the structural health of a structure may include the steps of: (1) coupling a structural health management apparatus to the structure, wherein the structural health management apparatus includes a carbon nanotube element, a piezoelectric element coupled to the carbon nanotube element, and electrode elements coupled to the carbon nanotube element and the piezoelectric element to form a layered structured, (2) generating, by the carbon nanotube element, an electrical response in response to an electromagnetic signal corresponding to a deformation of the carbon nanotube element, and (3) actuating the piezoelectric element in response to an electrical voltage applied to the piezoelectric element.

Other embodiments of the disclosed apparatus, system and method will become apparent from the following detailed description, the accompanying drawings and the appended claims.

DETAILED DESCRIPTION

Figure 1:
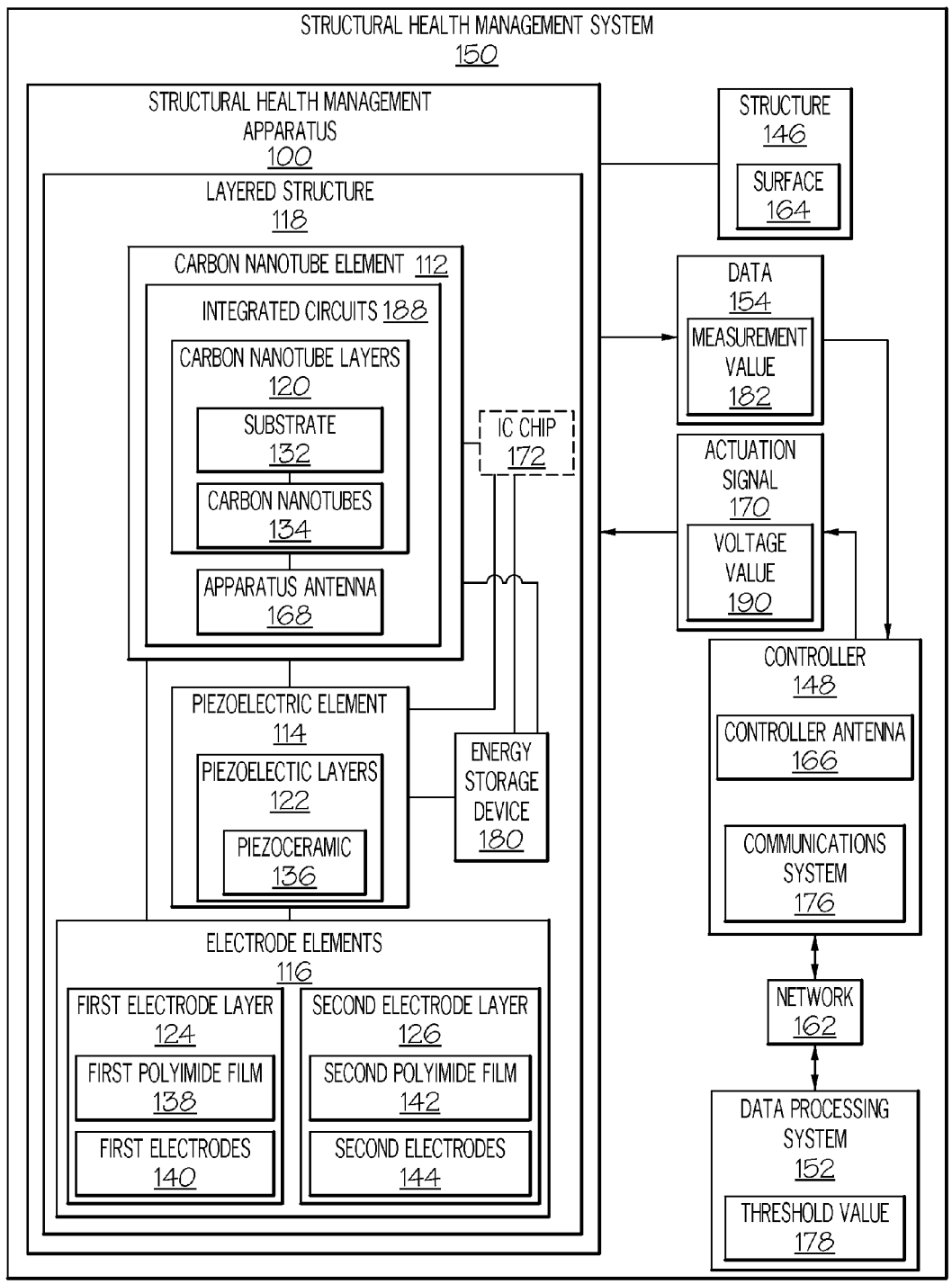
FIG. 1 is a schematic block diagram of one embodiment of the disclosed structural health management system.

The following detailed description refers to the accompanying drawings, which illustrate specific embodiments of the disclosure. Other embodiments having different structures and operations do not depart from the scope of the present disclosure. Like reference numerals may refer to the same element or component in the different drawings.

Figure 9:
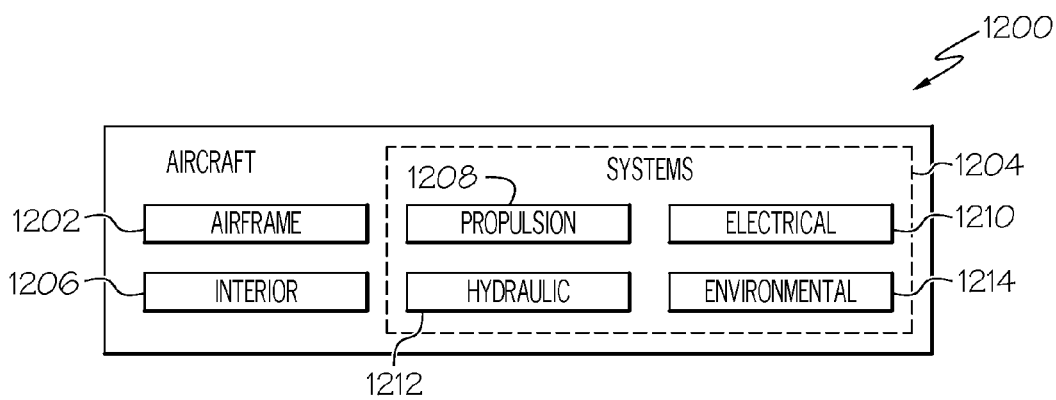
FIG. 9 is a schematic illustration of an aircraft.

In FIGS. 1 and 9, referred to above, solid lines, if any, connecting various elements and/or components may represent mechanical, electrical, fluid, optical, electromagnetic and other couplings and/or combinations thereof. As used herein, "coupled" means associated directly as well as indirectly. For example, a member A may be directly associated with a member B, or may be indirectly associated therewith, e.g., via another member C. It will be understood that not all relationships among the various disclosed elements are necessarily represented. Accordingly, couplings other than those depicted in the block diagrams may also exist. Dashed lines, if any, connecting blocks designating the various elements and/or components represent couplings similar in function and purpose to those represented by solid lines; however, couplings represented by the dashed lines may either be selectively provided or may relate to alternative examples of the present disclosure. Likewise, elements and/or components, if any, represented with dashed lines, indicate alternative examples of the present disclosure. One or more elements shown in solid and/or dashed lines may be omitted from a particular example without departing from the scope of the present disclosure. Environmental elements, if any, are represented with dotted lines. Virtual (imaginary) elements may also be shown for clarity. Those skilled in the art will appreciate that some of the features illustrated in FIGS. 1 and 9 may be combined in various ways without the need to include other features described in FIGS. 1 and 9, other drawing figures, and/or the accompanying disclosure, even though such combination or combinations are not explicitly illustrated herein. Similarly, additional features not limited to the examples presented, may be combined with some or all of the features shown and described herein.

Figure 7:
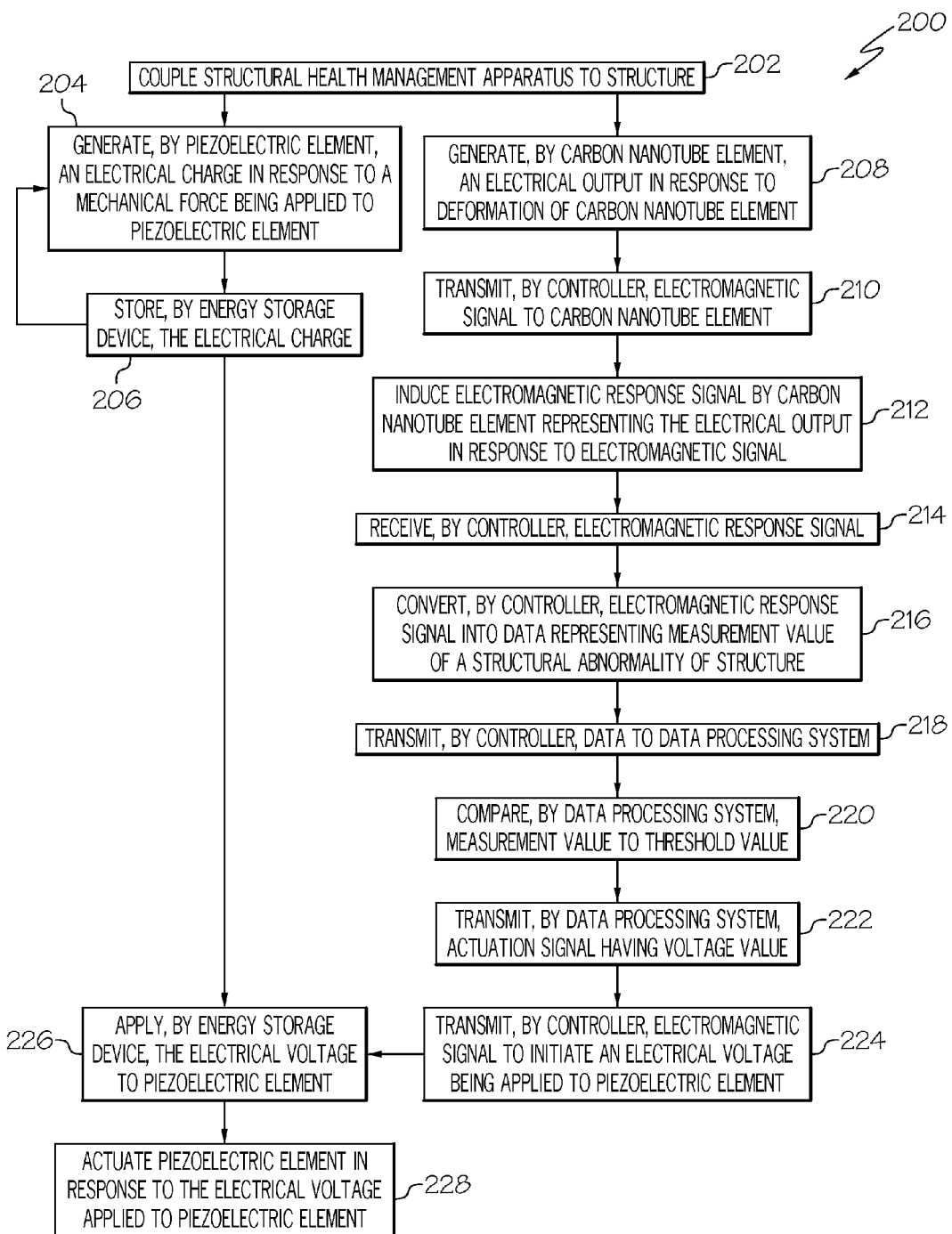
FIG. 7 is a flow diagram of one embodiment of the disclosed method for managing the structural health of the structure.
Figure 8:
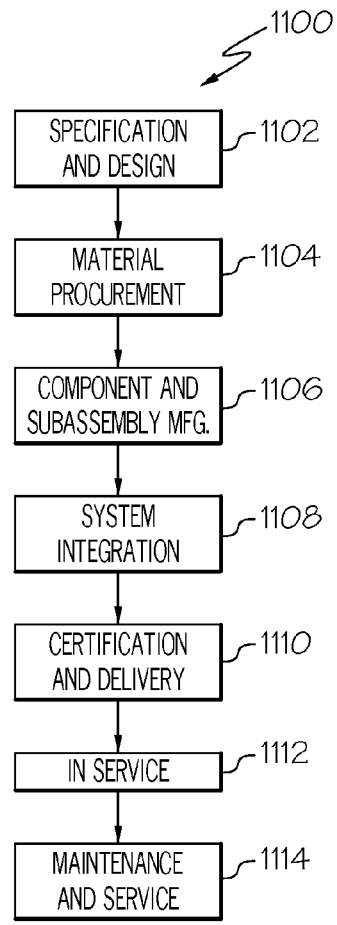
FIG. 8 is a block diagram of aircraft production and service methodology.

In FIGS. 7 and 8, referred to above, the blocks may represent operations and/or portions thereof and lines connecting the various blocks do not imply any particular order or dependency of the operations or portions thereof. Blocks represented by dashed lines (if any) indicate alternative operations and/or portions thereof. Dashed lines, if any, connecting the various blocks represent alternative dependencies of the operations or portions thereof. It will be understood that not all dependencies among the various disclosed operations are necessarily represented. FIGS. 7 and 8 and the accompanying disclosure describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously. Additionally, those skilled in the art will appreciate that not all operations described need be performed.

Reference herein to "example" means that one or more feature, structure, or characteristic described in connection with the example is included in at least one embodiment or implementation. The phrase "one example" or "another example" in various places in the specification may or may not be referring to the same example.

Unless otherwise indicated, the terms "first," "second," etc. are used herein merely as labels, and are not intended to impose ordinal, positional, or hierarchical requirements on the items to which these terms refer. Moreover, reference to a "second" item does not require or preclude the existence of lower-numbered item (e.g., a "first" item) and/or a higher-numbered item (e.g., a "third" item).

Referring to FIG. 1, one embodiment of structural health management apparatus, generally designated 100, is disclosed. Structural health management apparatus 100 includes carbon nanotube element 112 configured to generate an electrical output (e.g., an electrical charge) in response a mechanical deformation, piezoelectric element 114 configured to deform in response to an applied electrical voltage, and electrode elements 116 coupled to carbon nanotube element 112 and piezoelectric element 114. Piezoelectric element 114 is also configured to generate an electrical charge in response to a mechanical force.

Figure 2:
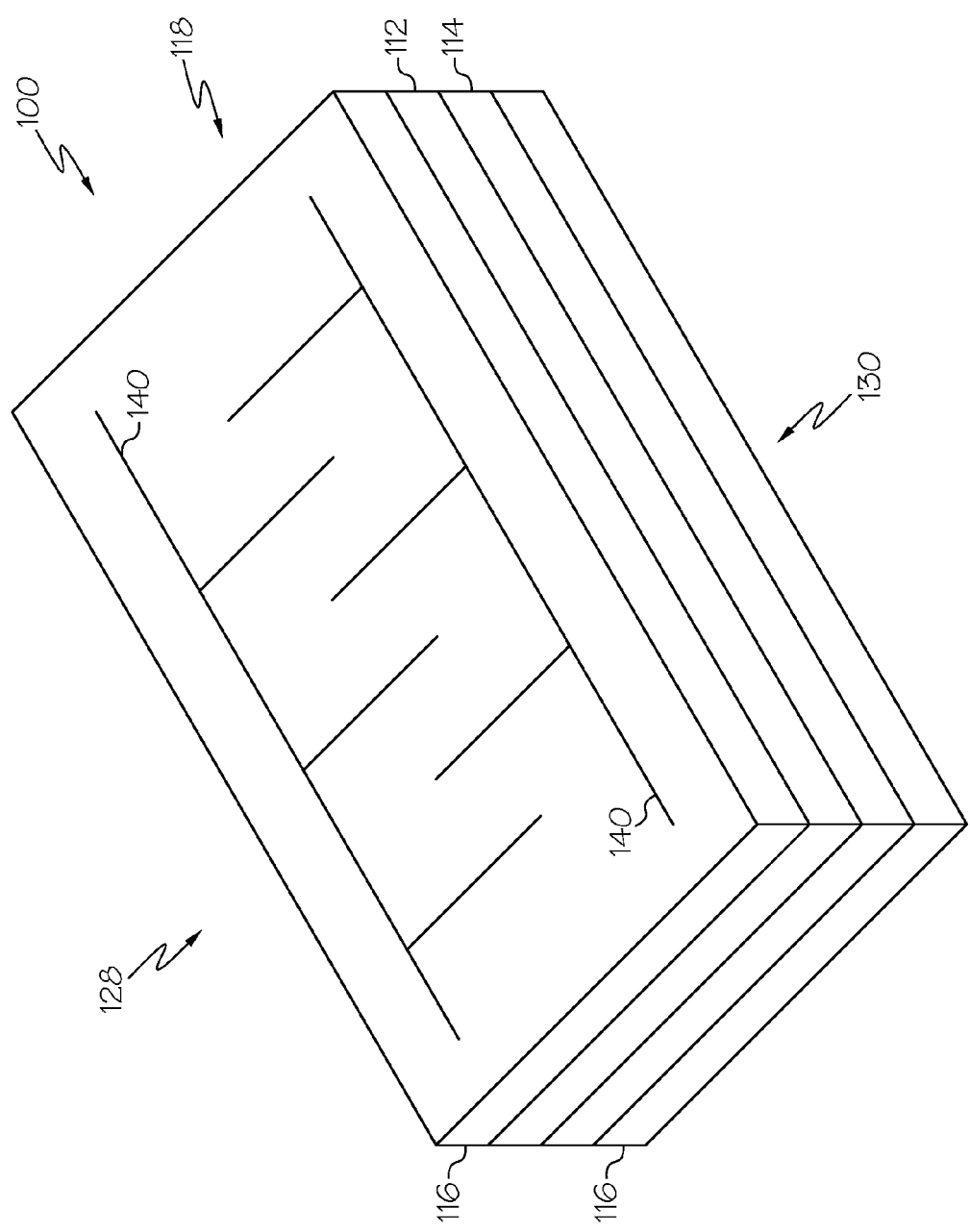
FIG. 2 is a schematic perspective view of one embodiment of the disclosed structural health management apparatus of FIG. 1.
Figure 3:
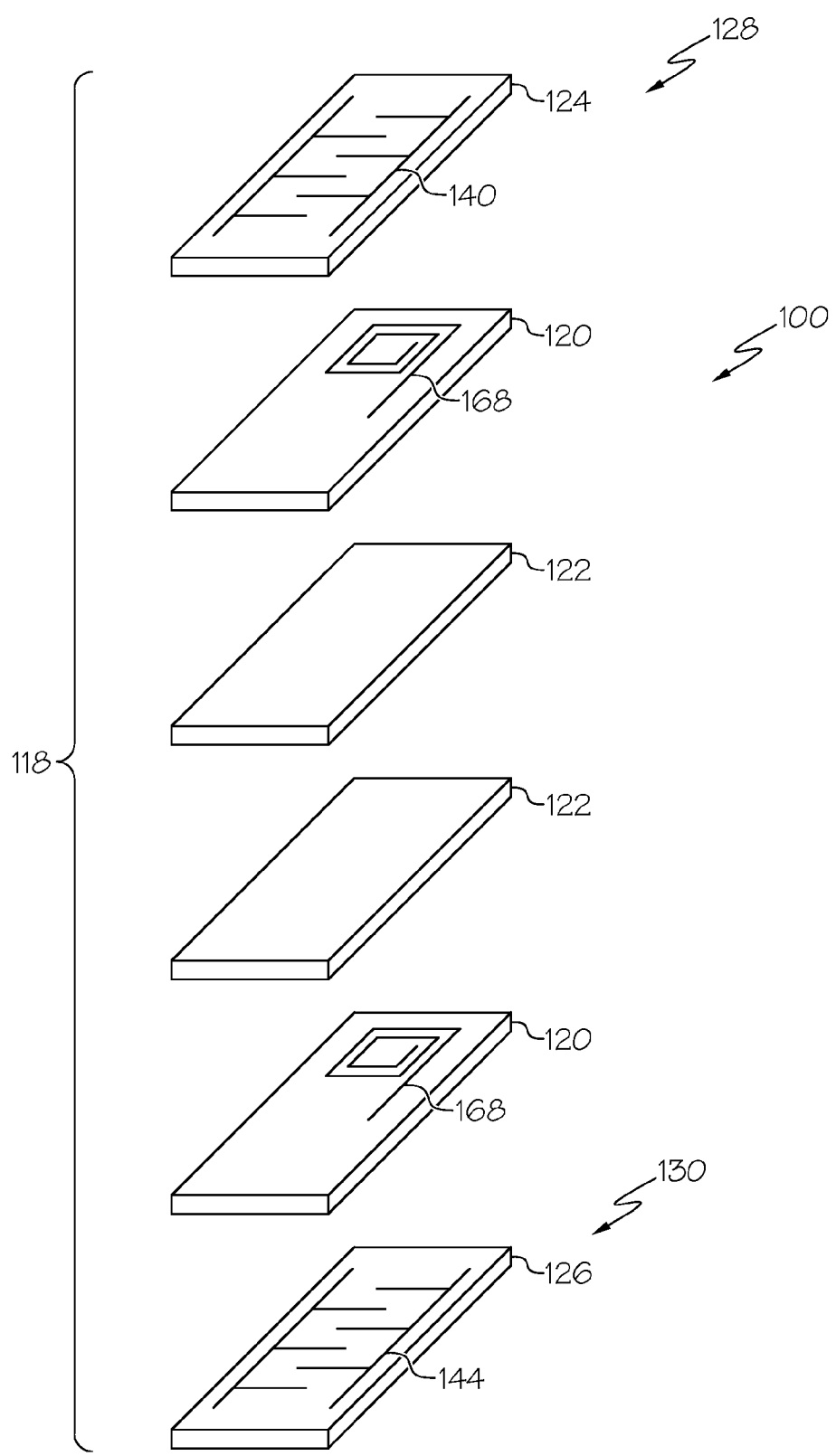
FIG. 3 is an exploded schematic perspective view of one embodiment of the structural health management apparatus of FIG. 1.

Referring to FIGS. 2 and 3, and with reference to FIG. 1, as one example, carbon nanotube element 112, piezoelectric element 114 and electrode elements 116 form layered structure 118. In one example implementation, carbon nanotube element 112 serves as a sensor (e.g., a strain gauge) and piezoelectric element 114 serves as an actuator. In another example implementation, carbon nanotube element 112 serves as a sensor, piezoelectric element 114 serves as an actuator, and piezoelectric element 114 serves as an energy harvester. In yet another example implementation, carbon nanotube element 112 serves as a sensor, piezoelectric element 114 serves as a sensor (e.g., a strain gauge), piezoelectric element 114 serves as an actuator, and piezoelectric element 114 serves as an energy harvester.

As a sensor, carbon nanotube element 112 generates electrical output under mechanical loads, for example, deformation or deflection of structural health management apparatus 100. The electrical output generated by carbon nanotube element 112 corresponds to the mechanical load (e.g., to the degree of deformation).

As an actuator, piezoelectric element 114 deforms (e.g., actuates) to overcome an excessive mechanical load, for example, an excessing deformation or deflection of structural health management apparatus 100. The degree of deformation or actuation of piezoelectric element 114 corresponds to the voltage applied to piezoelectric element 114.

As an energy harvester, piezoelectric element 114 generates electrical output under mechanical loads, for example, deformation or vibration of structural health management apparatus 100.

As a sensor, piezoelectric element 114 generates electrical output under mechanical loads, for example, deformation or deflection of structural health management apparatus 100. It should be appreciated that in certain embodiments carbon nanotube element 112 may act as a better sensor than piezoelectric element 114, therefore piezoelectric element 114 may not normally serve a sensor with carbon nanotube element 112.

Electrode elements 116 are coupled to (e.g., define) opposing sides, for example, first (e.g., top) side 128 and second (e.g., bottom) side 130, of layered structure 118. Electrode elements 116 are configured to transfer the applied electrical voltage to piezoelectric element 114 for actuation of piezoelectric element 114 when piezoelectric element 114 serves as the actuator. Electrode elements 116 are configured to transfer a generated electrical voltage (e.g., charge) generated by piezoelectric element 114 to energy storage device 180 when piezoelectric element 114 serves as the energy harvester.

Referring to FIG. 3, and with reference to FIGS. 1 and 2, carbon nanotube element 112 (FIG. 2) may include one or more carbon nanotube layers 120 (FIG. 3). Piezoelectric element 114 (FIG. 2) may include one or more piezoelectric layers 122 (FIG. 3). Electrode elements 116 (FIG. 2) include first electrode layer 124 and second electrode layer 126 opposite first electrode layer 124 (FIG. 3). First electrode layer 124 forms first (e.g., top) side 128 of layered structure 118 and second electrode layer 126 forms second (e.g., bottom) side 130 of layered structure 118 opposite first side 128. Carbon nanotube element 112 (e.g., one or more carbon nanotube layers 120) and piezoelectric element 114 (e.g., one or more piezoelectric layers 122) are sandwiched between first electrode layer 124 and second electrode layer 126.

The number of carbon nanotube layers 120 and the number of piezoelectric layers 122 may vary depending upon various factors including, but not limited to, the particular application of structural health management apparatus 100, the overall size (e.g., cross-sectional thickness) of structural health management apparatus 100 and the like. In the example structural health management apparatus 100 illustrated in FIG. 3, carbon nanotube element 112 includes two carbon nanotube layers 120 and piezoelectric element 116 includes two piezoelectric layers 122 forming layered structure 118. However, carbon nanotube element 112 may include only one carbon nanotube layer 120 or three of more carbon nanotube layers 120. Similarly, piezoelectric element 116 may include one piezoelectric layer 122 or three or more piezoelectric layers 122.

The configuration of carbon nanotube layers 120 and piezoelectric layers 122 within layered structure 118 may vary depending upon various factors including, but not limited to, the particular application of structural health management apparatus 100, the number of carbon nanotube layers 120, the number of piezoelectric layers 122 and the like. In the example structural health management apparatus 100 illustrated in FIG. 3, two piezoelectric layers 122 are adjacent to each other and in the middle (e.g., defining the center) of layered structure 118 and two opposing carbon nanotube layers 120 sandwich the two piezoelectric layers 122. However, other stacked configurations of the layered structure 118 are also contemplated. As one example, layered structure 118 may alternate between carbon nanotube layers 120 and piezoelectric layers 122 from first side 128 to second side 130.

Referring to FIG. 1, and with reference to FIGS. 2 and 3, carbon nanotube layer 120 may be formed from any suitable materials. As one example, carbon nanotube layer 120 includes substrate 132 (FIG. 1) and carbon nanotubes 134 (FIG. 1). Carbon nanotubes 134 may include any allotrope of carbon with a cylindrical nanostructure. Carbon nanotubes 134 are coupled to one side (e.g., one major surface) or both sides (e.g., opposing major surfaces) of substrate 132. Carbon nanotubes 134 may be randomly oriented or distributed (e.g., not aligned in any direction) on the surface of substrate 132. As one specific, non-limiting example, substrate 132 may be glass (e.g., a glass film or sheet). For example, carbon nanotubes 134 are attached to a thin glass (not explicitly illustrated) using a layer-by layer manufacturing process where the thin microscope glass is dipped into a solution that has carbon nanotubes 132 dispersed in a soluble agent (e.g., water). The solution may also include other hardeners. During this dipping process the carbon nanotubes 132 stick on the glass and the process is repeated as many times as needed depending on a desired thickness of carbon nanotube layer 120. As another specific, non-limiting, substrate 132 may be a nonwoven fabric (e.g., a composite veil). For example, the solution of carbon nanotubes 132 mixed with water is poured on a veil (not explicitly illustrated) and carbon nanotubes 132 remain on the outer surface of the veil as the solution passes through the veil. The veil with attached carbon nanotubes 132 is then passed along heat rolls to form carbon nanotube layer 120.

Carbon nanotubes 134 (FIG. 1) are conductive due to a phenomenon known as a tunneling effect. Carbon nanotubes 134 of each one of carbon nanotube layers 120 (FIG. 1) may produce different electrical responses (e.g., electrical output or charge) due to the tunneling effect of carbon nanotubes 134 in response to different mechanical loads (e.g., at different deformations or deflections of carbon nanotube element 112) applied to structural health management apparatus 100 (e.g., mechanical loads applied to structure 146 to which structural health management apparatus 100 is coupled). The electrical output depends on the distance between the different carbon nanotubes 134 dispersed along carbon nanotube layer 120 (e.g., coupled to the surface of substrate 132). Changes to the distance between carbon nanotubes 134 affect the resistance or conductivity measured as output from carbon nanotube element 120, which is how carbon nanotube layer 120 or carbon nanotube element 112 is used as a sensor. With structural health monitoring apparatus 100 attached to structure 146, during excessive loading of structure 146, structural health monitoring apparatus 100 and, thus, carbon nanotube element 112 will deform causing the measurable resistance to change, which can be correlated to strain measurements (e.g., decoded by controller 148). Thus, carbon nanotube element 112 may serve as a sensor.

Piezoelectric layer 122 may be formed from any suitable piezoelectric material. As one specific, non-limiting example, piezoelectric layer 122 includes a synthetic ceramic material with randomly oriented grains (e.g., piezoceramic 136) (FIG. 1). Other materials are also contemplated including, but not limited to, naturally occurring crystals, synthetic crystals, polymers and the like.

Due to the piezoelectric effect, piezoelectric element 114 generates a mechanical strain resulting from the applied electrical voltage. An electrical signal (e.g., actuation signal 170) is sent to piezoelectric element 114 once an excessive deformation is detected, for example, by carbon nanotube element 112. The electrical signal triggers piezoelectric element 114 (e.g., one or more piezoelectric layers 122) to actuate. Thus, piezoelectric element 114 may serve as a mechanical actuator.

Similarly, due to the piezoelectric effect, piezoelectric element 114 generates an electrical output (e.g., an electrical charge) in response to different mechanical loads (e.g., at different deformations or deflections of piezoelectric element 114) applied to structural health management apparatus 100 (e.g., mechanical loads applied to structure 146 to which structural health management apparatus 100 is coupled). Thus, piezoelectric element 114 may serve as a sensor.

Conversely, due to the piezoelectric effect, piezoelectric element 114 generates an electrical charge (e.g., voltage) in response to mechanical forces (e.g., at different deformations or deflections of piezoelectric element 114) applied to structural health management apparatus 100 (e.g., mechanical forces applied to structure 146 to which structural health management apparatus 100 is coupled). Thus, piezoelectric element 114 may serve as an energy harvester.

As one example, one or more piezoelectric layers 122 may be piezoelectric actuators (e.g., deform in response to the applied voltage) and one or more piezoelectric layers 122 may be piezoelectric energy harvesters (e.g., generate an electrical charge in response to deformation).

First electrode layer 124 and second electrode layer 126 may include any suitable substrate having integrated electrodes. As one specific, non-limiting example, first electrode layer 124 includes first polyimide film 138 having first electrodes 140 formed on or set within (e.g., etched in) first polyimide film 138. Second electrode layer 126 includes second polyimide film 142 having second electrodes 144 formed on or set within (e.g., etched in) second polyimide film 142. First electrodes 140 and second electrodes 144 may be interdigitated to increase sensitivity and detection limits.

In one example construction, one or more carbon nanotube layers 120, one or more piezoelectric layers 122, first electrode layer 124 and second electrode layer 126 may be co-cured to form a laminated layered structure 118. As one example, an epoxy resin (not explicitly illustrated) is applied to surfaces of one or more of carbon nanotube layers 120, piezoelectric layers 122, first electrode layer 124 and/or second electrode layer 126. Carbon nanotube layers 120 and piezoelectric layers 122 are then stacked in an appropriate configuration (e.g., based on the number of carbon nanotube layers 120 and/or piezoelectric layers 122, the particular application of structural health management apparatus 100, etc.) and first electrode layer 124 and second electrode layer 126 are stacked on both sides of the stack of carbon nanotube layers 120 and/or piezoelectric layers 122 to form the layered structure 118. Layered structure 118 is then subjected to a vacuum press and the epoxy is cured.

Figure 4:
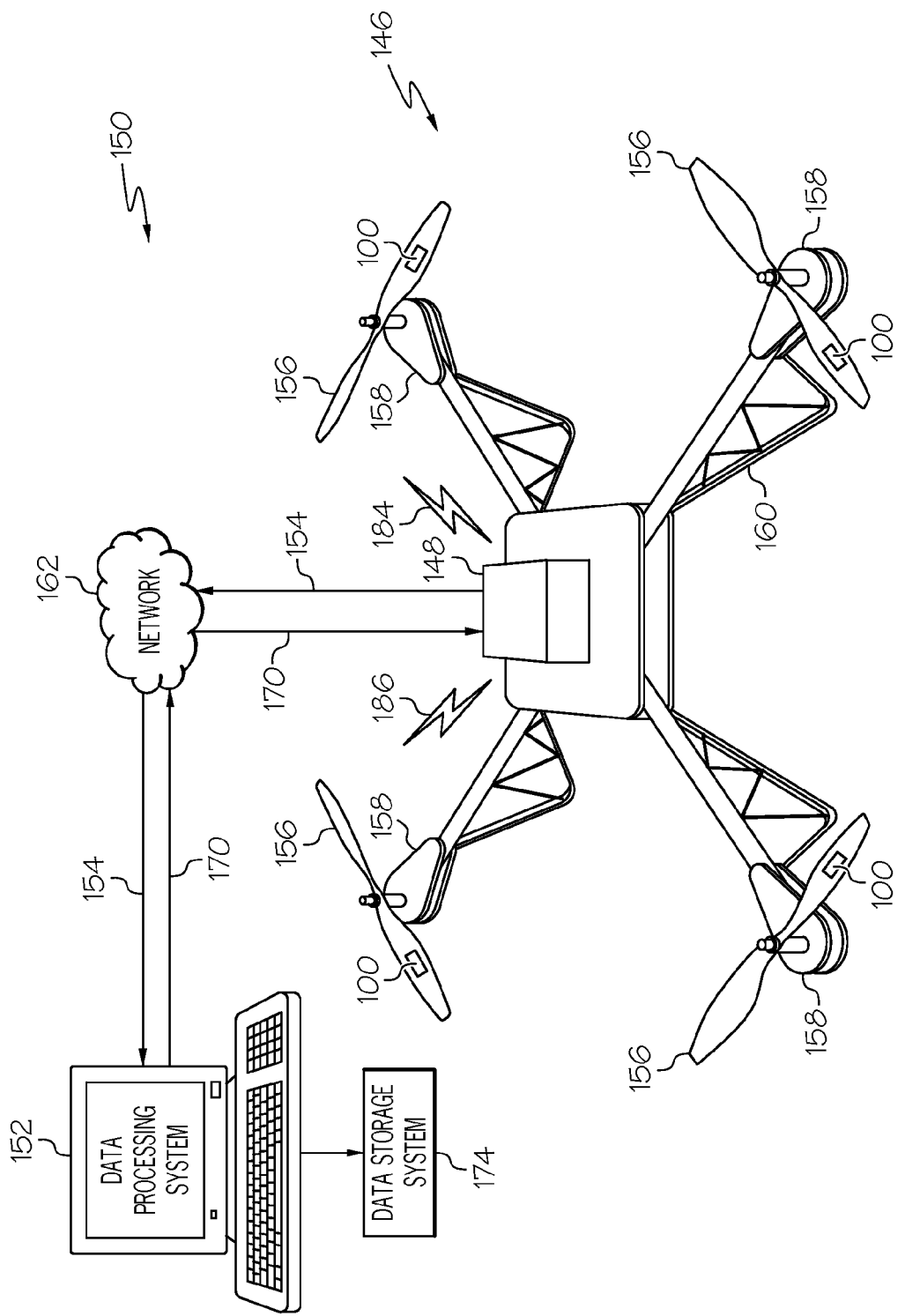
FIG. 4 is a schematic diagram of one embodiment of the structural health management system of FIG. 1.

Referring to FIG. 4, and with reference to FIG. 1, structural health management system, generally designated 150, may manage the health of structure 146. Structural health management system 150 may monitor the health of structure 146 and/or respond to certain abnormalities within structure 146 upon a predetermined threshold being met. Structural health management system 150 includes controller 148. Controller 148 is communicatively coupled to structural health management apparatus 100. Structural health management apparatus 100 is coupled to structure 146. In one example implementation, structural health management apparatus 100 is configured to sense abnormalities within structure 146 such as excessive deformation, deflection, vibration, or other mechanical loads.

In one example implementation, structural health management apparatus 100 is configured to monitor the structural health of structure 146 (e.g., sense a structural abnormality). As one example, controller 148 is configured to receive the electrical output generated by carbon nanotube element 112 (e.g., in response to deformation) and interpret (e.g., decode) the electrical output as data 152 representing a measurement (measurement value 182) (FIG. 1) of the structural abnormality (e.g., a strain measurement). In another example implementation, structural health management apparatus 100 is configured to manage the structural health of structure 146 (e.g., counter excessive structural abnormalities). As one example, controller 148 is configured to initiate actuation of piezoelectric element 114 (e.g., by application of the electrical voltage).

Referring to FIG. 4, as one example, structure 146 may be aircraft 160. Generally, aircraft 160 may include any fixed-wing or rotary-wing aircraft. As one specific, non-limiting example, and as illustrated in FIG. 4, aircraft 160 may be an unmanned aerial vehicle ("UAV"). As another specific, non-limiting example, aircraft 160 may be helicopter. As yet another specific, non-limiting example, aircraft 160 may be an airplane.

Figure 5:
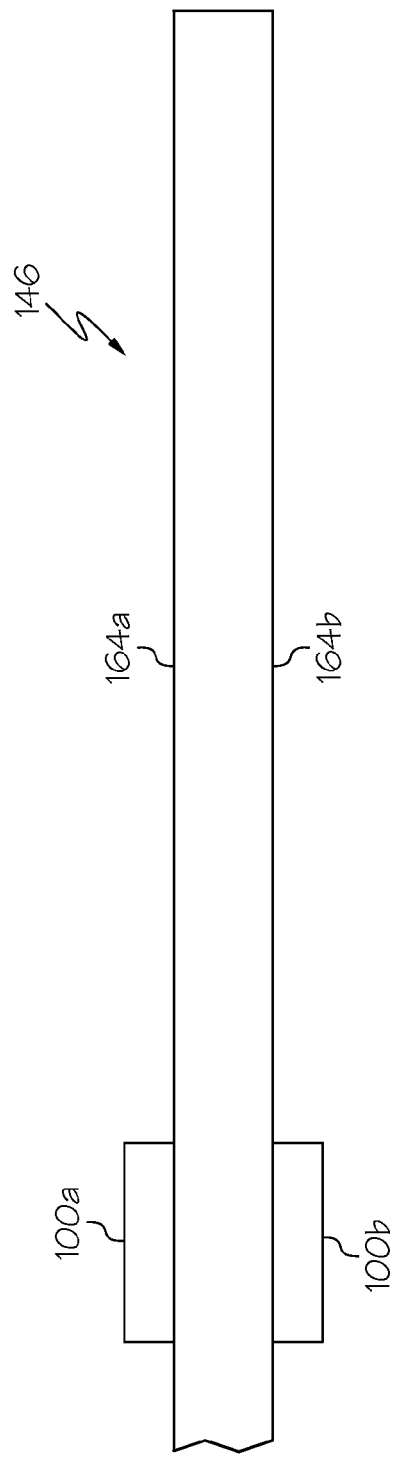
FIG. 5 is a schematic side elevational view of one implementation of the structural health management apparatus of FIG. 1 coupled to a structure.
Figure 6:
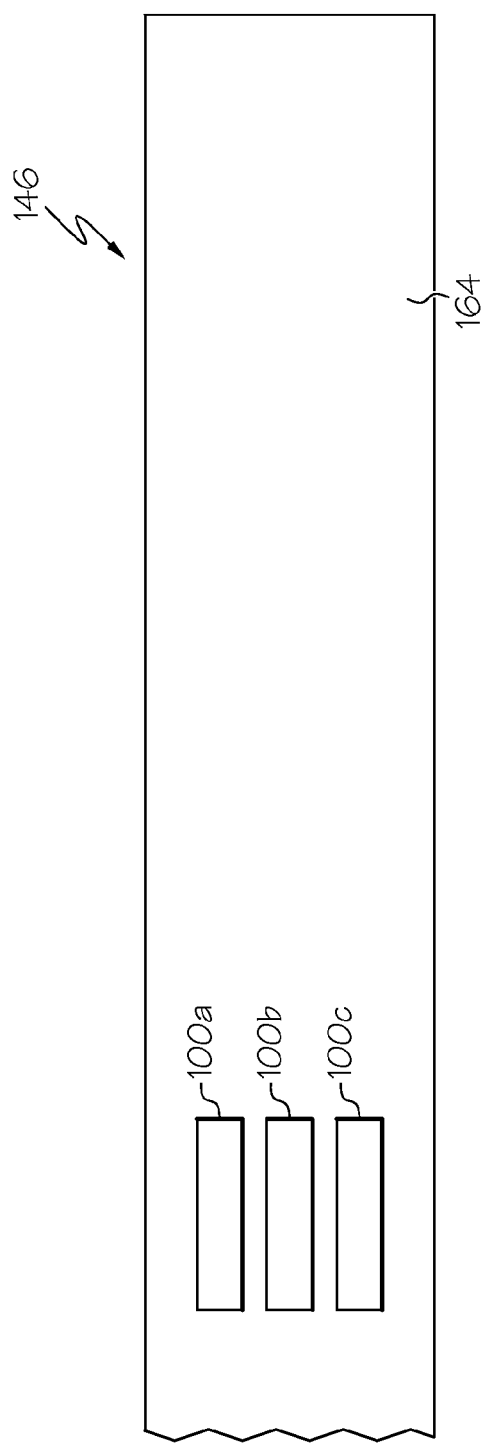
FIG. 6 is a schematic side elevational view of another implementation of the structural health management apparatus of FIG. 1 coupled to the structure.

Referring to FIGS. 4-6, as another example, structure 146 may be propeller 158 of aircraft 160. As another example, structure 146 may be blade 156 of propeller 158 of aircraft 160. For example, aircraft 160 may include any rotary aircraft including one or more propellers.

As yet another example, structure 146 may be a primary structure, a secondary structure or any other structural component of aircraft 160 such as a wing, a tail boom, a stabilizer, a skin panel and the like. As used herein, the term primary structure generally refers to any structure that is essential for carrying loads (e.g., strains, stresses and/or forces) encountered during movement (e.g., during flight of aircraft 160). As used herein, the term secondary structure generally refers to any structure that assists the primary structure in carrying loads encountered during movement.

While examples of structural health management system 150 and structural health management apparatus 100 are described and illustrated as being used to monitor and manage the structural health of aircraft structures, other structures are also contemplated. As examples, structure 146 may include any structural component of a vehicle (e.g., a land vehicle, a water vehicle, etc.), a fixed structure (e.g., a building) and the like.

Referring to FIG. 5, as one example implementation, one or more structural health management apparatus 100 may be coupled to structure 146 (e.g., propeller blade 156). As one example, one of structural health management apparatus 100 (e.g., first structural health management apparatus 100a) may be coupled to one side or surface (e.g., first surface 164a) of structure 146 and another one of structural health management apparatus 100 (e.g., second structural health management apparatus 100b) may be coupled to another side or surface (e.g., second surface 164b) of structure 146 opposite first structural health management apparatus 100a.

Referring to FIG. 6, as one example implementation, a plurality of structural health management apparatus 100 may be coupled to one or more sides or surfaces 164 of structure 146. As one example, the plurality of structural health management apparatus 100 (e.g., first structural health management apparatus 100a, second structural health management apparatus 100b and third structural health management apparatus 100c) may be coupled to one side or surface 164 of structure 146. As one example, the plurality of structural health management apparatus 100 may be adjacent to and aligned with each other, as illustrated in FIG. 6. As another example, the plurality of structural health management apparatus 100 may be spaced apart from each other across surface 164 of structure 146. The plurality of structural health management apparatus 100 may be aligned with each other or offset from each other. While not explicitly illustrated in FIG. 6, another plurality of structural health management apparatus 100 may be coupled to the opposite surface of structure 146.

The overall size (e.g., a length dimension and/or width dimension) of structural health management apparatus 100 may depend upon various factors including, but not limited to, the size of structure 146, the type of structure 146, the particular application of structure 146, the particular application of structural health management apparatus 100 and the like.

Referring to FIG. 4, and with reference to FIGS. 1-3, during operation, structure 146 may encounter various mechanical loads (e.g., strains, stresses and/or other mechanical forces). As one example, during flight, propeller blade 156 may deform, deflect and/or vibrate in response such loads. Structural health management apparatus 100 coupled to structure 146 (e.g., propeller blade 156) deforms, deflects and/or vibrates along with structure 146. As one example, mechanical deformation of structure 146 (e.g., blade 156) is transferred to structural health management apparatus 100 coupled to surface 164 (FIG. 6) of structure 146 (FIGS. 5 and 6). Carbon nanotube element 112 (e.g., one or more carbon nanotube layers 120) may generate (e.g., induce) the electrical output in response to the mechanical load applied to structure 146 (e.g., deformation of propeller blade 156). The electrical outputs generated by carbon nanotube element 112 will differ based on the mechanical deformation of carbon nanotube element 112. As one example, the electrical outputs generated by carbon nanotube element 112 represent strain values measured in structure 146 (e.g., degrees of deformation or deflection of structure 146) due to the loads applied to structure 146. The electrical output (e.g., the measured electrical resistance or conductivity) from carbon nanotube element 112 may be decoded by controller 148 as data 154 representing measurement values 182 (FIG. 1) corresponding to the mechanical load (e.g., the degree of deformation).

Referring to FIG. 4, and with reference to FIG. 1, in one example implementation, controller 148 may be wirelessly connected to structural health management apparatus 100. Electromagnetic signal 184 (FIG. 4) (e.g., a radio frequency ("RF") signal) may be a transmitted by controller 148 to structural health management apparatus 100 and, thus, to carbon nanotube element 112. As one example, controller 148 includes controller antenna 166 (FIG. 1). As one example, controller antenna 166 is a radio frequency ("RF") reader antenna 166. Structural health management apparatus 100 includes apparatus antenna 168 (FIGS. 1 and 3). As one example, apparatus antenna 168 is one or more radio frequency ("RF") tag antennas. Apparatus antenna 168 may be associated with carbon nanotube element 112. As one example, one apparatus antenna 168 is coupled to at least one carbon nanotube layer 120. As another example, one apparatus antenna 168 is coupled to each one of carbon nanotube layers 120, as illustrated in FIG. 4.

Apparatus antenna 168 may be any suitable radio frequency ("RF") antenna. As one specific, non-limiting example, apparatus antenna 168 may be a flat coil antenna coupled to substrate 132 of carbon nanotube layer 120.

Controller antenna 166 transmits electromagnetic signal 184 (e.g., RF signal) to carbon nanotube element 112 of structural health management apparatus 100. Electromagnetic signal 184 induces an electrical response from carbon nanotube element 112. As one example, electromagnetic signal 184 transforms the electrical output generated by carbon nanotube layer 122 into electromagnetic response signal 186 (FIG. 4). Apparatus antenna 168 transmits electromagnetic response signal 186 back to controller antenna 166 where the electrical response (e.g., the measurement of electrical output) is analyzed and interpreted (e.g., decoded) by controller 148 into data 154 representing measurement value 182 (FIG. 1) of the structural abnormality (e.g., strain).

Generally, carbon nanotube element 112 (e.g., each carbon nanotube layer 120) is electrically equivalent to radio controlled ("RC") parallel circuit. Because carbon nanotube element 112 acts as a RLC oscillating circuit, the resonant frequency changes with the change in mechanical behavior of structure 146. Therefore carbon nanotube element 112 may be employed as an integral element of a passive wireless sensor. Carbon nanotube element 112 may act as a strain sensor because the conductivity or resistance of carbon nanotube element 112 (e.g., of carbon nanotubes 134) changes in response to a shape change (e.g., deformation) of carbon nanotube element 112. When apparatus antenna 168 is integrated with carbon nanotube element 112 (e.g., carbon nanotube layers 120), carbon nanotube element 112 may be inductively coupled with controller 148 having controller antenna 166 thus, rendering structural health management apparatus 100 completely wireless.

Operation of structural health management apparatus 100 as a wireless strain-sensing device is based upon passive radio-frequency identification ("RFID") technology. Controller 148 having controller antenna 166 serves as an interrogating RFID reader and carbon nanotube element 112 having apparatus antenna 168 serves as an RFID tag. Thus, carbon nanotube element 112 and apparatus antenna 168 are a basic integrated circuit 188 (FIG. 1). As an alternative, structural health management apparatus 100 may also include an independent integrated circuit ("IC") chip 172 (FIG. 1) coupled to carbon nanotube element 112. As one example, controller 148 via controller antenna 166 (e.g., as the RF reader) emits electromagnetic signal 184 (e.g., an interrogation signal), which is received by carbon nanotube element 112 via apparatus antenna 168 (e.g., as the RF tag) at power threshold $P_1$. Electromagnetic signal 184 induces electromagnetic response signal 186 from carbon nanotube element 112 and apparatus antenna 168. Thus, carbon nanotube element 112 via apparatus antenna 168 reflects electromagnetic signal 184 back to controller 148 as electromagnetic response signal 186 with power level $P_1'$. This reflection is known as backscattering. The power level $P_1'$ represents the electrical output (e.g., resistance or conductivity measurement) of carbon nanotube element 112 at the current deformation of carbon nanotube element 112, which is then processed by controller 148 and interpreted as a strain measurement.

As another example implementation, a wired connection (not explicitly illustrated) may connect controller 148 to structural health management apparatus 100. The electromagnetic signal may be an electrical voltage transmitted by controller 148 to carbon nanotube element 112. As one example, controller 148 is electrically connected to first electrodes 140 and/or second electrodes 144 to transmit the electrical voltage to carbon nanotube element 112 (e.g., carbon nanotube layers 120). Carbon nanotube element 112 transmits the electromagnetic response signal representing the electrical output back to controller 148 in response to the applied electrical voltage. Controller 148 then processes the electrical output as data 154 (e.g., the strain measurement).

Thus, in either the wired or the wireless examples, controller 148 interrogates carbon nanotube element 112 of structural health management apparatus 100 (e.g., serving as the sensor) by application of the electromagnetic signal, which induces the electromagnetic response signal from the carbon nanotube element 112 to controller 148. Controller 148 processes the electrical output generated by the carbon nanotube element 112 to represent the measurement of the structural abnormality occurring within structure 146.

Controller 148 may include any combination of electronic processing devices, memory devices, communication devices, input/output ("I/O") devices, and/or other known components and may perform various processing and/or communication related functions. As one example, controller 148 includes one or more microcontrollers, microprocessors, microcomputers, central processing units ("CPUs"), application specific integrated circuits ("ASICs") or any other suitable processing device known in the art.

As one example, controller 148 (e.g., via a processing device) processes the electrical output received from carbon nanotube element 112 and interprets the electrical output as the strain measurement of structure 146. As one example, controller 148 includes appropriate processing hardware and software (e.g., a correlation algorithm) configured to correlate the electrical output (e.g., resistance or conductivity measurements) to a strain measurement. The strain measurement is one example of data 154 representing the health status of structure 146. Other measurement values 182 (FIG. 1) representing different structural abnormalities may also be data 154 representing the health status of structure 146.

Referring to FIG. 4, and with reference to FIG. 1, as expressed above, structural health management apparatus 100 communicates with controller 148 (e.g., wired or wirelessly). Controller 148 in turn communicates with data processing system 152. Controller 148 is configured to process (e.g., decode) the electrical output provided by carbon nanotube element 112 into data 154 and transmit data 154 representing the health status of structure 146 to data processing system 152.

Data processing system 152 is configured to analyze and/or store data 154 received from controller 148. As one example, controller 148 and data processing system 152 may communicate over a wireless network 162 or other wireless communication link. In such an example, data processing system 152 is located remotely from structure 146, structural health management apparatus 100 and controller 148.

Structural health management apparatus 100 may include communications system 176 (FIG. 1) coupled to controller 148. Communications system 176 may include a radio frequency antenna and appropriate radio transceiver configured to communicate wirelessly with data processing system 152 over network 162. Communications system 176 may be integrated within controller 148. As one specific, non-limiting example, communications system 176 may include software-defined radio ("SDR") in which some or the entire physical layer functions are software defined. SDR technology may provide multi-mode, multi-band and/or multi-functional wireless devices that can be enhanced using software upgrades.

As another example, controller 148 and data processing system 152 may commutate over a wired connection or link (not explicitly illustrated). In such an example, data processing system 152 is located proximate to structure 146, structural health management apparatus 100 and controller 148. For example, data processing system 152 may be a data processing system within aircraft 160.

Generally, data processing system 152 may include a computer configured to process information. Data processing system 152 may include a processor unit, a memory unit, a persistent storage unit, a communications unit, an input/output (I/O) unit, a display, and a communications interface. The communications interface may provide communications between one or more of the processor unit, the memory unit, the persistent storage unit, the communications unit, the input/output (I/O) unit, and the display. For example, the memory unit, the persistent storage unit, the communications unit, the input/output (I/O) unit, and the display may be resources accessible by the processor unit via the communications interface.

Structural health management system 150 may also include data storage system 174 (FIG. 4). Data storage system 174 may be communicatively coupled to data processing system 152, for example, to store data 154.

Data processing system 152 is configured to process data 154 received from controller 148, analyze data 154 and monitor the structural health of structure 146. As one example (FIG. 1), data 154 includes measurement values 182 (e.g., of strain measurements) detected from structure 146, for example, in response to mechanical loads applied to structure 146. Data processing system 152 includes appropriate processing hardware and software configured to actively compare measurement values 182 of data 154 to predetermined threshold value 178 (FIG. 1). As one example, threshold value 178 represents a maximum allowable measurement value 182 (e.g., strain measurement) for structure 146. Data 154 may also include measurements representing other structural abnormalities and threshold value 178 may represent a maximum allowable measurement value for those other structural abnormalities.

After data 154 is received from controller 148, data 154 is analyzed by data processing system 152 and a decision is made whether the mechanical loads are excessive (e.g., a determination with respect to the presence of potential damage or actual damage) based on the comparative analysis of measurement value 182 and threshold value 178.

As one example implementation, the results from the comparative analysis may be used for scheduling maintenance procedures on structure 146 based on regular condition monitoring. As one example, when a mechanical load applied to structure 146 and sensed by structural health management apparatus 100 is deemed excessive by data processing system 152, an inspection and/or maintenance procedure may be automatically scheduled.

As another example implementation, the results from the comparative analysis may be used to actively manage the mechanical loads applied to structure 146 or other structural abnormalities. For example, structural health management apparatus 100 may counter excessive deformation, deflection, vibration, etc. of structure 146 produced by the loads applied to structure 146. As one example, upon data 154 indicating that a structural abnormality (e.g., strain measurement) is approaching or has reached predetermined threshold value 178, data processing system 152 is configured to transmit actuation signal 170 to controller 148. In response to actuation signal 170 from data processing system 152 (e.g., transmitted wirelessly over network 162), controller 148 is configured to instruct structural health management apparatus 100 to counter the structural abnormality (e.g., deflection, deformation, vibration, etc.). As one specific, non-limiting example, upon data processing system 152 comparing data 154 to threshold value 178 and determining that the deformation, deflection, vibration, etc. of structure 146 created by application of a mechanical load is excessive (e.g., is approaching a level where structure 146 may be negatively affected or damaged), controller 148 may actuate piezoelectric element 114 to counter (e.g., act against) the deformation, deflection, vibration, etc.

Referring to FIG. 1, in the wireless example, structural health management system 150 includes energy storage device 180. Energy storage device 180 is coupled to structural health management apparatus 100. As one example, energy storage device 180 is a capacitor. As another example, energy storage device 180 is a battery as an alternative to the capacitor. Optionally, as yet another example, energy storage device 180 may include a battery as a backup to the capacitor.

Energy storage device 180 is electrically coupled to first electrode 140 and/or second electrode 144 and is configured to receive and store the electrical charge generated by piezoelectric element 114 (e.g., serving as the energy harvester) in response to the mechanical force (e.g., deformation, deflection, vibration) transferred to structural health management apparatus 100 by structure 146.

Controller 148 is configured to transmit actuation signal 170 to structural health management apparatus 100 (e.g., to piezoelectric element 114 serving as the actuator). As one example, the transmission of actuation signal 170 from controller 148 to structural health management apparatus 100 is performed wirelessly. As one example, the wireless communication between controller 148 and piezoelectric element 114 (e.g., serving as the actuator) may be performed using the same concept as the wireless communication between controller 148 and carbon nanotube element 112 (e.g., serving as the sensor).

As one specific, non-limiting example, actuation signal 170 may include voltage value 190 representing a voltage corresponding to the degree of actuation of piezoelectric element 114 needed to counter the structural abnormality sensed by carbon nanotube element 112. Controller 148 may be configured to process (e.g., transform) voltage value 190 of actuation signal 170 into an electromagnetic signal (e.g., electromagnetic signal 184), which is transmitted to piezoelectric element 114.

In the wireless implementation, electromagnetic signal 184 is an RF signal. Electromagnetic signal 184 is transmitted by controller antenna 166 and received by apparatus antenna 168. In certain implementations of structural health management system 150, controller 148 may include more than one controller antennas 166 and structural health management apparatus 100 may include more than one apparatus antenna 168. As one example, one or more apparatus antennas 168 may be associated with carbon nanotube element 112 serving as the sensor and one or more apparatus antennas 168 associated with piezoelectric element 114 serving as the actuator. Different controller antennas 166 may communicate with the different apparatus antennas 168 depending upon the function of structural health management apparatus 100 (e.g., as a sensor or as an actuator) as not to interfere with wireless communication between different elements.

As one general example implementation, upon determination by data processing system 152 that structural health management apparatus 100 is to be used to counter the structural abnormality, controller 148 transmits actuation signal 170 to structural health management apparatus 100. In response to actuation signal 170, controller 148 instructs energy storage device 180 to transfer the applied electrical voltage corresponding to voltage value 190 to piezoelectric element 114 (e.g., one or more piezoelectric layers 122) to initiate actuation of piezoelectric element 114 to counter the structural abnormality within structure 146.

As one example, upon reception of electromagnetic signal 184, electromagnetic signal 184 is processed by structural health management apparatus 100 (e.g., by integrated circuit 188 or IC chip 172) and decoded back into voltage value 190. An electrical voltage corresponding to voltage value 190 is applied to piezoelectric element 114 from energy storage device 180 (FIG. 1) to actuate piezoelectric element 114. Thus, the post-processed information (e.g., from electromagnetic signal 184) informs structural health management apparatus 100 to apply a pre-defined voltage value (e.g., voltage value 190) based on the amount of deflection or vibration observed by carbon nanotube element 112 serving as the sensor.

As one specific, non-limiting illustrative example, measurement value 182 processed by controller 148 from the electrical output of carbon nanotube element 112 is a strain value measured as 3000 microstrain. Measurement value 182 is analyzed by data processing system 152 and is compared to threshold value 178, which is below 3000 microstrain. Data processing system 152 transmits actuation signal 170 having voltage value 190 of 5 volts. Controller 148 initiates application of a 5-volt potential difference to piezoelectric element 114 in order to overcome that deformation. Those skilled in the art will recognize that if the strain is different, a different voltage will be applied.

Referring to FIG. 7, and with reference to FIGS. 1-6, one embodiment of method, generally designated 200, for managing the structural health of structure 146 is disclosed. Modifications, additions, or omissions may be made to method 200 without departing from the scope of the present disclosure. Method 200 may include more, fewer, or other steps. Additionally, steps may be performed in any suitable order.

Referring to FIG. 7, and with reference to FIGS. 1-4, in one example implementation, method 200 includes the step of coupling structural health management apparatus 100 to structure 146, as shown at block 202. Structural health management apparatus 100 includes carbon nanotube element 112, piezoelectric element 114 coupled to carbon nanotube element 112, and electrode elements 116 coupled to carbon nanotube element 112 and piezoelectric element 114 to form layered structure 118.

Referring to FIG. 7, and with reference to FIG. 1, in one example implementation, method 200 includes the step of generating, by piezoelectric element 114, the electrical charge in response to any mechanical force being applied to piezoelectric element 114, as shown at block 204.

Referring to FIG. 7, and with reference to FIG. 1, in one example implementation, method 200 includes the step of storing, by energy storage device 180, the electrical charge, as shown at block 206.

Referring to FIG. 7, and with reference to FIG. 1, in one example implementation, method 200 includes the step of generating, by carbon nanotube element 112, the electrical output in response to the deformation of carbon nanotube element 112, as shown at block 208.

Referring to FIG. 7, and with reference to FIG. 1, in one example implementation, method 200 includes the step of transmitting, by controller 148, electromagnetic signal 184 to carbon nanotube element 112, as shown at block 210. Electromagnetic signal 184 is received by carbon nanotube element 112 via apparatus antenna 168. Electromagnetic signal 184 is used to interrogate carbon nanotube element 112 serving as the sensor. Thus, electromagnetic signal 184 is an interrogating electromagnetic signal.

Referring to FIG. 7, and with reference to FIG. 1, in one example implementation, method 200 includes the step of inducing electromagnetic response signal 186 by carbon nanotube element 112 representing the electrical output in response to electromagnetic signal 184, as shown at block 212. Electromagnetic signal 184 is used for data transformation (e.g., transforming the electrical output of carbon nanotube element 112 into electromagnetic response signal 186) between carbon nanotube element 112 and controller 148.

Referring to FIG. 7, and with reference to FIG. 1, in one example implementation, method 200 includes the step of receiving, by controller 148, electromagnetic response signal 186, as shown at block 214.

Referring to FIG. 7, and with reference to FIG. 1, in one example implementation, method 200 includes the step of converting, by controller 148, electromagnetic response signal 186 into data 154 representing measurement value 182 of the structural abnormality of structure 146, as shown at block 216.

Referring to FIG. 7, and with reference to FIG. 1, in one example implementation, method 200 includes the step of transmitting, by controller 148, data 154 to data processing system 152, as shown at block 218.

Referring to FIG. 7, and with reference to FIG. 1, in one example implementation, method 200 includes the step of comparing, by data processing system 152, measurement value 182 to threshold value 178, as shown at block 220.

Referring to FIG. 7, and with reference to FIG. 1, in one example implementation, method 200 includes the step of transmitting, by data processing system 152, actuation signal 170 having voltage value 190, as shown at block 222. Voltage value 190 corresponds to (e.g., is decoded as) the voltage required to achieve a corresponding actuation in piezoelectric element 114 necessary to counter the structural abnormality in structure 146. The step of transmitting actuation signal 170 (block 222) occurs following the comparison of measurement value 182 to threshold value 178 (block 220), and, for example, when the structural abnormality is approaching or has reached a level or point where a countermeasure is desired. As one example, actuation signal 170 is transmitted (block 220) when measurement value 182 greater than threshold value 187. As another example, actuation signal 170 is transmitted when measurement value 182 is equal to threshold value 187. As yet another example, actuation signal 170 is transmitted when measurement value 182 approximates (e.g., is less than, but is approaching or increasing towards) threshold value 187.

Referring to FIG. 7, and with reference to FIG. 1, in one example implementation, method 200 includes the step of transmitting, by controller 148, electromagnetic signal 184 to initiate the electrical voltage being applied to piezoelectric element 114, as shown at block 224. Electromagnetic signal 184 is received by piezoelectric element 114 via apparatus antenna 168. Electromagnetic signal 184 is used to actuate piezoelectric element 114 serving as the actuator. Thus, electromagnetic signal 184 is an actuating electromagnetic signal.

Referring to FIG. 7, and with reference to FIG. 1, in one example implementation, method 200 includes the step of applying, by energy storage device 180, the electrical voltage to piezoelectric element 114, as shown at block 226.

Referring to FIG. 7, and with reference to FIG. 1, in one example implementation, method 200 includes the step of actuating (e.g., deforming) piezoelectric element 114 in response to the electrical voltage applied to piezoelectric element 114, as shown at block 228. Deformation of piezoelectric element 114 counters the structural abnormality within structure 146. As one example, deformation of piezoelectric element 114 actuates structure 146 back to a nominal position, for example, in the case of excessive strain (e.g., when measured value 182 approximates, is equal to or greater than threshold value 178).

Examples of the present disclosure may be described in the context of aircraft manufacturing and service method 1100 as shown in FIG. 8 and aircraft 1200 as shown in FIG. 9. Aircraft 1200 may be one example of aircraft 160 illustrated in FIG. 4.

During pre-production, the illustrative method 1100 may include specification and design, as shown at block 1102, of aircraft 1200 and material procurement, as shown at block 1104. During production, component and subassembly manufacturing, as shown at block 1106, and system integration, as shown at block 1108, of aircraft 1200 may take place. Thereafter, aircraft 1200 may go through certification and delivery, as shown block 1110, to be placed in service, as shown at block 1112. While in service, aircraft 1200 may be scheduled for routine maintenance and service, as shown at block 1114. Routine maintenance and service may include modification, reconfiguration, refurbishment, etc. of one or more systems of aircraft 1200.

Each of the processes of illustrative method 1100 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 9, aircraft 1200 produced by illustrative method 1100 may include airframe 1202 with a plurality of high-level systems 1204 and interior 1206. Examples of high-level systems 1204 include one or more of propulsion system 1208, electrical system 1210, hydraulic system 1212 and environmental system 1214. Any number of other systems may be included. Although an aerospace example is shown, the principles disclosed herein may be applied to other industries, such as the automotive industry, the marine industry, the construction industry or the like.

The systems, apparatus and methods shown or described herein may be employed during any one or more of the stages of the manufacturing and service method 1100. For example, components or subassemblies corresponding to component and subassembly manufacturing (block 1106) may be fabricated or manufactured in a manner similar to components or subassemblies produced while aircraft 1200 is in service (block 1112). Also, one or more examples of the apparatus, systems and methods, or combination thereof may be utilized during production stages (blocks 1108 and 1110). Similarly, one or more examples of the apparatus and methods, or a combination thereof, may be utilized, for example and without limitation, while aircraft 1200 is in service (block 1112) and during maintenance and service stage (block 1114) for example, by providing structural health management of one or more structural components of aircraft 1200.

Although various embodiments of the disclosed system, apparatus and method have been shown and described, modifications may occur to those skilled in the art upon reading the specification. The present application includes such modifications and is limited only by the scope of the claims.

What is claimed is:

1. A structural health management apparatus comprising:
   a sensor element comprising:
      a carbon nanotube layer configured to generate an electrical output in response to deformation due to a mechanical load applied to said carbon nanotube layer and transmit an electrical response signal representing said electrical output in response to an electromagnetic signal applied to said carbon nanotube layer; and
      an antenna coupled to said carbon nanotube layer and configured to receive said electromagnetic signal to induce said electrical response signal;
   an actuator element coupled to said sensor element and comprising a piezoelectric layer configured to deform in response to an electrical voltage applied to said piezoelectric layer; and
   an electrode element communicatively coupled to said actuator element and configured to apply said electrical voltage to said piezoelectric layer.

2. The apparatus of claim 1 further comprising an energy harvester element comprising another piezoelectric layer configured to generate an electrical charge in response to a mechanical force applied to said another piezoelectric layer.

3. The apparatus of claim 1 wherein said electrical response signal is correlated to a strain measurement.

4. The apparatus of claim 1 wherein said carbon nanotube layer comprise:
   a substrate; and
   carbon nanotubes deposited on said substrate.

5. The apparatus of claim 1 wherein said piezoelectric layer comprises a piezoceramic.

6. The apparatus of claim 1 wherein:
   said electrode element is communicatively coupled to said carbon nanotube layer;
   said electrical signal is an electric voltage; and
   said electrode element is configured to apply said electrical voltage to said carbon nanotube layer to induce said electrical response signal.

7. The apparatus of claim 6 wherein said electrode element comprises:
   a first electrode layer communicatively coupled to said carbon nanotube layer and comprising a first substrate having interdigitated first electrodes; and
   a second electrode layer communicatively coupled to said piezoelectric layer and comprising a second substrate having interdigitated second electrodes; and
   wherein said carbon nanotube layer and said piezoelectric layer are sandwiched between said first electrode layer and said second electrode layer.

8. The apparatus of claim 2 further comprising an energy storage device communicatively coupled to said energy harvester element and configured to store said electrical charge.

9. A structural health management system comprising:
   a structural health management apparatus comprising:

a sensor element comprising a carbon nanotube layer configured to generate an electrical output in response to deformation due to a mechanical load applied to said carbon nanotube layer;

an actuator element coupled to said sensor element and comprising a piezoelectric layer configured to deform in response to an electrical voltage applied to said piezoelectric layer; and electrode elements communicatively coupled to said sensor element and said actuator element; and a controller communicatively coupled to said electrode elements, wherein said controller is configured to convert said electrical output into data representing a measurement value of a structural abnormality and initiate application of said electrical voltage to said piezoelectric layer to counter said structural abnormality upon said measurement value being equal to or greater than a predetermined threshold value.

10. The system of claim 9 further comprising a data processing system communicatively coupled to said controller, wherein said data processing system is configured to compare said data to said predetermined threshold value.

11. The system of claim 9 further comprising an energy harvester element comprising another piezoelectric layer configured to generate an electrical charge in response to a mechanical force applied to said another piezoelectric layer.

12. The system of claim 11 further comprising an energy storage device communicatively coupled to said energy harvester element, wherein said energy storage device is configured to store said electrical charge generated by said another piezoelectric layer and apply said electrical voltage to said piezoelectric layer.

13. The system of claim 9 wherein:
said sensor element comprises a plurality of carbon nanotube layers;
said actuator element comprises a plurality of piezoelectric layers;
said electrode elements comprise:
  a first electrode layer communicatively coupled to said plurality of carbon nanotube layers and comprising a first substrate having interdigitated first electrodes; and
  a second electrode layer communicatively coupled to said plurality of piezoelectric layers and comprising a second substrate having interdigitated second electrodes; and
said plurality of carbon nanotube layers and said plurality of piezoelectric layers are sandwiched between said first electrode layer and said second electrode layer to form a layered structure.

14. The system of claim 9 wherein:
said controller is configured to transmit an electrical signal to said carbon nanotube layer that induces an electrical response signal from said carbon nanotube layer representing said electrical output; and
said data processing system correlates said electrical response signal to a strain measurement.

15. The system of claim 14 wherein:
said electrical signal comprises an electromagnetic signal;
said sensor element further comprises an apparatus antenna coupled to said carbon nanotube layer and configured to receive said electromagnetic signal and transmit said electrical response signal as an electromagnetic response signal; and
said controller comprises a controller antenna configured to transmit said electromagnetic signal and receive said electromagnetic response signal.

16. A method for managing structural health of a structure, said method comprising:
coupling a structural health management apparatus to said structure, wherein said structural health management apparatus comprises:
  a sensor element comprising a carbon nanotube layer;
  an actuator element coupled to said sensor element and comprising a piezoelectric layer; and
  electrode elements communicatively coupled to said sensor element and said actuator element;
generating, by said sensor element, an electrical output in response to deformation of said carbon nanotube layer; and
deforming said actuator element in response to an electrical voltage applied to said piezoelectric layer.

17. The method of claim 16 further comprising:
transmitting, by a controller, an electrical signal to said carbon nanotube layer;
inducing, by said carbon nanotube layer, an electrical response signal representing said electrical output in response to said electrical signal;
receiving, by said controller, said electrical response signal;
converting, by said controller, said electrical response signal into data representing a measurement value of a structural abnormality of said structure;
transmitting, by said controller, said data to a data processing system; and
comparing, by said data processing system, said measurement value to a threshold value.

18. The method of claim 17 further comprising transmitting said electrical voltage to said piezoelectric layer when said measurement value is approximately equal to or greater than said threshold value.

19. The method of claim 16 wherein:
said structural health management apparatus further comprises:
  an energy harvester element comprising another piezoelectric layer; and
  an energy storage device communicatively coupled to said energy harvester element; and
said method further comprises:
  generating, by said energy harvester element, an electrical charge in response to a mechanical force being applied to said another piezoelectric element layer;
  storing, by said energy storage device, said electrical charge; and
  applying, by said energy storage device, said electrical voltage to said piezoelectric layer.

20. The method of claim 17 wherein said measurement value comprises a strain measurement.

* * * * *